(12) United States Patent
Lee et al.

(10) Patent No.: US 11,211,443 B2
(45) Date of Patent: Dec. 28, 2021

(54) DISPLAY APPARATUS

(71) Applicant: Samsung Display Co., Ltd., Yongin-si (KR)

(72) Inventors: Wonse Lee, Yongin-si (KR); Ae Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 93 days.

(21) Appl. No.: 16/040,252

(22) Filed: Jul. 19, 2018

(65) Prior Publication Data

US 2019/0043938 A1 Feb. 7, 2019

(30) Foreign Application Priority Data

Aug. 2, 2017 (KR) .................. 10-2017-0098069

(51) Int. Cl.
*H01L 27/32* (2006.01)
*G09G 3/3258* (2016.01)
(Continued)

(52) U.S. Cl.
CPC .......... *H01L 27/3276* (2013.01); *G09G 3/20* (2013.01); *G09G 3/3258* (2013.01); *H01L 27/124* (2013.01); *H01L 27/1222* (2013.01); *H01L 27/3246* (2013.01); *H01L 27/3248* (2013.01); *H01L 27/3258* (2013.01); *H01L 29/78675* (2013.01); *H01L 29/78678* (2013.01);
(Continued)

(58) Field of Classification Search
CPC ............. H01L 27/3276; H01L 27/1222; H01L 27/124; H01L 27/3246; H01L 27/3248; H01L 27/3258; H01L 29/78675; H01L 29/78678; H01L 51/5203; H01L 51/5246; H01L 27/1255; H01L 27/3265; G09G 3/20; G09G 3/3258; G09G 3/3225; G09G 2300/0426; G09G 2310/0232
See application file for complete search history.

(56) References Cited

U.S. PATENT DOCUMENTS 8,004,178 B2 8/2011 Lee
9,000,428 B2 4/2015 Lee et al.
(Continued)

FOREIGN PATENT DOCUMENTS

JP 2003-66475 A 3/2003
KR 10-0830981 B1 5/2008
(Continued)

*Primary Examiner* — Patrick N Edouard
*Assistant Examiner* — Eboni N Giles
(74) *Attorney, Agent, or Firm* — Lewis Roca Rothgerber Christie LLP

(57) ABSTRACT

A display apparatus includes: a substrate including a display area where a plurality of pixels are arranged to display an image, and a non-display area around the display area; an opposite electrode commonly provided to the plurality of pixels; a driving voltage supply line extending in a first direction to correspond to one of sides of the display area in the non-display area, and configured to supply a driving voltage to the plurality of pixels; and a common voltage supply line comprising a bent portion that is bent to correspond to one corner of the driving voltage supply line in the non-display area, and configured to supply a common voltage by being connected to the opposite electrode.

18 Claims, 9 Drawing Sheets

(51) Int. Cl.
*H01L 27/12* (2006.01)
*H01L 29/786* (2006.01)
*H01L 51/52* (2006.01)
*G09G 3/20* (2006.01)
*G09G 3/3225* (2016.01)

(52) U.S. Cl.
CPC ...... *H01L 51/5203* (2013.01); *H01L 51/5246* (2013.01); *G09G 3/3225* (2013.01); *G09G 2300/0426* (2013.01); *G09G 2310/0232* (2013.01); *H01L 27/1255* (2013.01); *H01L 27/3265* (2013.01)

(56) References Cited

U.S. PATENT DOCUMENTS

| | | | | |
|---|---|---|---|---|
| 2008/0252203 | A1* | 10/2008 | Lee | H01L 27/3276 313/504 |
| 2009/0268145 | A1* | 10/2009 | Anjo | G02F 1/1345 349/141 |
| 2010/0123846 | A1* | 5/2010 | Kim | G02F 1/13458 349/46 |
| 2016/0343792 | A1 | 11/2016 | Jang | |
| 2017/0033312 | A1 | 2/2017 | Kim et al. | |

FOREIGN PATENT DOCUMENTS

| KR | 10-2014-0133053 A | 11/2014 |
|---|---|---|
| KR | 10-2017-0015629 A | 2/2017 |

* cited by examiner

DISPLAY APPARATUS

CROSS-REFERENCE TO RELATED APPLICATION

This application claims priority to and the benefit of Korean Patent Application No. 10-2017-0098069, filed on Aug. 2, 2017, in the Korean Intellectual Property Office, the disclosure of which is incorporated herein in its entirety by reference.

BACKGROUND

1. Field

One or more embodiments relate to a display apparatus.

2. Description of the Related Art

A display apparatus is an apparatus that visually displays data. Such a display apparatus includes a substrate divided into a display area and a non-display area. In the display area, a gate line and a data line are insulated from each other, and a plurality of pixel regions are defined in the display area as the gate line and the data line cross each other. Also, a thin-film transistor (TFT) and a pixel electrode electrically connected to the TFT are provided correspondingly to each of the pixel regions in the display area. Also, an opposite electrode commonly provided in the pixel regions is provided in the display area. A gate driver, a data driver, a controller, and various wires transmitting an electric signal to the display region may be provided in the non-display area.

The use of the display apparatus is diversifying. Also, the range of use thereof is extending as the display apparatus is thin and light. According to the diversified use of display apparatus, a demand for technology of expanding the display area that provides an image while relatively reducing the non-display area that does not provide an image is increasing while designing the display apparatus.

The above information discussed in this Background section is only for enhancement of understanding of the background of the described technology and therefore it may contain information that does not constitute prior art that is already known to a person having ordinary skill in the art.

SUMMARY

One or more embodiments relate to a display apparatus, and a display apparatus in which an area of a non-display area may be reduced.

One or more embodiments include a display apparatus in which performance is maintained while an area of a non-display area is reduced.

Additional aspects will be set forth in part in the description which follows and, in part, will be apparent from the description, or may be learned by practice of the presented embodiments.

According to one or more embodiments, a display apparatus includes: a substrate including a display area where a plurality of pixels are arranged to display an image, and a non-display area around the display area; an opposite electrode commonly provided to the plurality of pixels; a driving voltage supply line extending in a first direction to correspond to one of sides of the display area in the non-display area, and configured to supply a driving voltage to the plurality of pixels; and a common voltage supply line comprising a bent portion that is bent to correspond to one corner of the driving voltage supply line in the non-display area, and configured to supply a common voltage by being connected to the opposite electrode, wherein an inner side of the bent portion has a stepped shape or has an inclined side with respect to the first direction, and the opposite electrode overlaps at least parts of the display area, the driving voltage supply line, and the common voltage supply line, and has one side extending in the first direction through the stepped shape or the inclined side.

According to some example embodiments, an end portion of the driving voltage supply line has a stepped shape or an inclined side to correspond to a shape of the bent portion.

According to some example embodiments, at least a part of the common voltage supply line is spaced apart from the driving voltage supply line and extends in the first direction, and one side of the opposite electrode is at least between the driving voltage supply line and the common voltage supply line extending in the first direction.

According to some example embodiments, the common voltage supply line surrounds at least a portion of the display area, and the opposite electrode overlaps at least a part of the common voltage supply line at the portion of the display area.

According to some example embodiments, the display apparatus further includes: a data distribution circuit unit between the display area and the driving voltage supply line, and comprising at least one thin-film transistor (TFT) to distribute a data signal supplied to the plurality of pixels; and a connection conductive layer overlapping the data distribution circuit unit with an insulating layer in between, and electrically connecting the driving voltage supply line and the display area.

According to some example embodiments, the display area comprises a thin film transistor (TFT) comprising a semiconductor layer, a gate electrode, a source electrode, and a drain electrode, and a pixel electrode connected to the TFT, and the connection conductive layer is formed of a same material as the pixel electrode.

According to some example embodiments, the display apparatus further includes a terminal unit configured to apply an electric signal to the display area in the non-display area, wherein the driving voltage supply line further comprises a driving connector extending in a second direction crossing the first direction, wherein the driving connector is connected to the terminal unit.

According to some example embodiments, the display apparatus further includes a sealing member surrounding the display area, wherein the sealing member is spaced apart from the opposite electrode.

According to some example embodiments, the display area includes a thin film transistor (TFT) comprising a semiconductor layer, a gate electrode, a source electrode, and a drain electrode, and the driving voltage supply line and the common voltage supply line include a same material as the source electrode.

According to some example embodiments, the display area further includes: a first planarization layer covering the TFT; a conductive layer over the first planarization layer; and a second planarization layer covering the conductive layer, wherein each of the driving voltage supply line and the common voltage supply line comprises a first layer and a second layer that are stacked on each other, wherein the first layer is formed of a same material as the source electrode and the second layer is formed of a same material as the conductive layer.

According to some embodiments, a display apparatus includes: a substrate including a display area where a plurality of pixels are arranged to display an image, and a non-display area around the display area; an opposite electrode commonly provided to the plurality of pixels; a driving voltage supply line extending in a first direction to correspond to any one side of the display area in the non-display area, and configured to supply a driving voltage to the plurality of pixels; and a common voltage supply line connected to the opposite electrode to supply a common voltage, wherein a partial region of the common voltage supply line has a stepped shape or an inclined side with respect to a first direction, and one side of the opposite electrode extends in the first direction through the stepped shape or the inclined side.

According to some example embodiments, the partial region of the common voltage supply line having the shaped shape or the inclined side faces the driving voltage supply line, and the driving voltage supply line has a stepped shape or an inclined side correspondingly to a shape of the common voltage supply line.

According to some example embodiments, at least a portion of one side of the opposite electrode extending in the first direction is spaced apart in parallel from the common voltage supply line extending in the first direction.

According to some example embodiments, the display apparatus further includes: a data distribution circuit unit between the display area and the driving voltage supply line, and comprising at least one thin-film transistor (TFT) configured to distribute a data signal supplied to the plurality of pixels; and a connection conductive layer overlapping the data distribution circuit unit with an insulating layer in between, and electrically connecting the driving voltage supply line and the display area.

According to some example embodiments, the display area includes a TFT comprising a semiconductor layer, a gate electrode, a source electrode, and a drain electrode, and a pixel electrode connected to the TFT, and the connection conductive layer is formed of a same material as the pixel electrode.

According to some example embodiments, the display area further includes a TFT, a first planarization layer covering the TFT, a conductive layer provided over the first planarization layer, and a second planarization layer covering the conductive layer, and the connection conductive layer is formed of a same material as the conductive layer.

According to some example embodiments, the display apparatus further includes a terminal unit configured to apply an electric signal to the display area in the non-display area, wherein the data distribution circuit unit is connected to the terminal unit.

According to some example embodiments, the common voltage supply line surrounds at least a portion of the display area, the opposite electrode has a rectangular shape having a first side extending in the first direction and a second side extending in a second direction crossing the first direction, and the second side of the opposite electrode overlaps the common voltage supply line.

According to some example embodiments, the display area includes a TFT comprising a semiconductor layer, a gate electrode, a source electrode, and a drain electrode, and the driving voltage supply line and a common voltage supply line are formed of a same material as the source electrode.

According to some example embodiments, the display area further includes: a first planarization layer covering the TFT; a conductive layer over the first planarization layer; and a second planarization layer covering the conductive layer, wherein each of the driving voltage supply line and the common voltage supply line comprises a first layer and a second layer that are stacked on each other, wherein the first layer is formed of a same material as the source electrode and the second layer is formed of a same material as the conductive layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
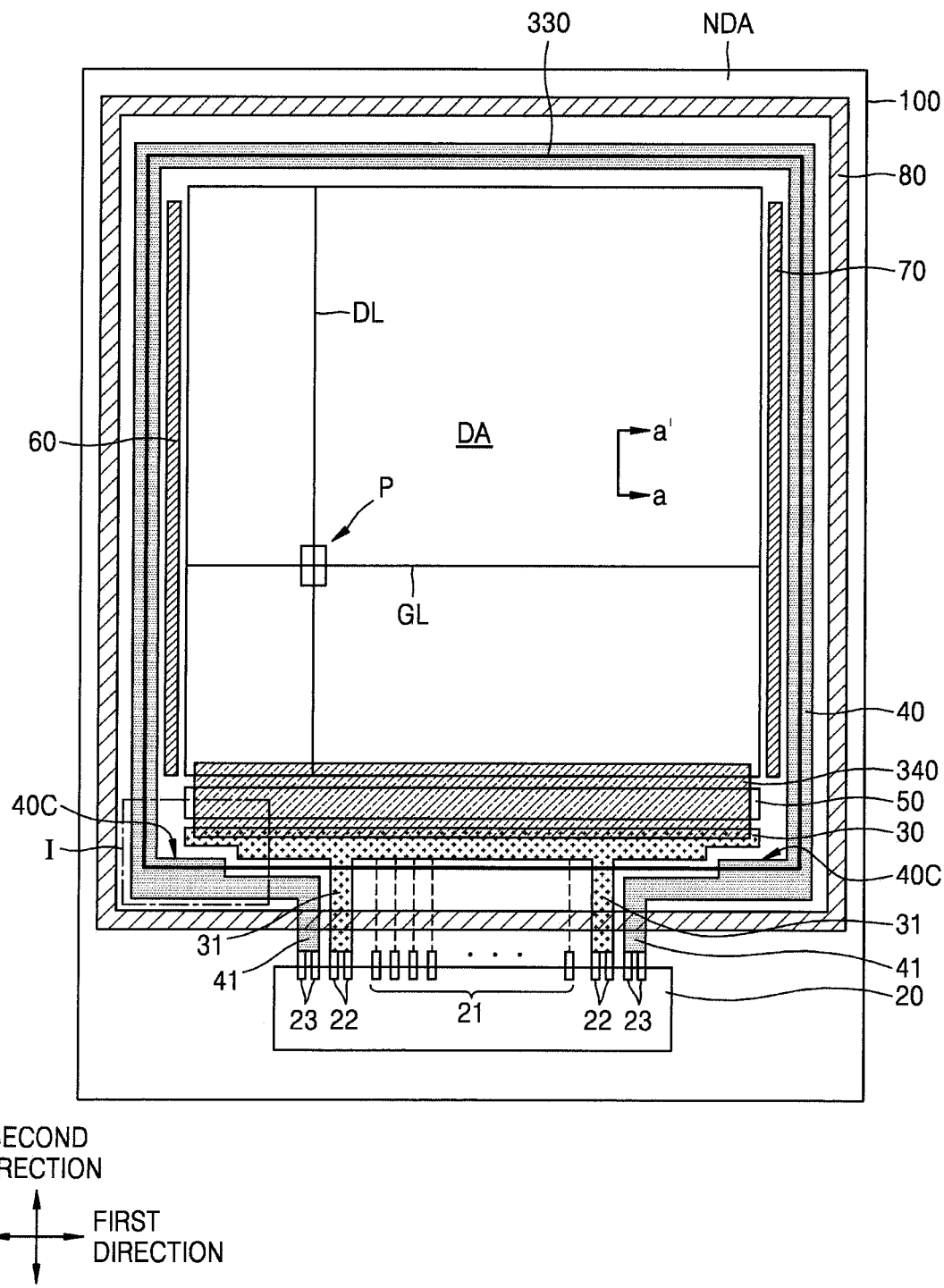
FIG. 1 is a plan view of a part of a display apparatus, according to some example embodiments of the present invention.

Reference will now be made in detail to embodiments, examples of which are illustrated in the accompanying drawings. In this regard, the present embodiments may have different forms and should not be construed as being limited to the descriptions set forth herein. Accordingly, some example embodiments are merely described below, by referring to the figures, to explain aspects of the present description.

In drawings, like reference numerals refer to like elements throughout and overlapping descriptions shall not be repeated.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, because sizes and thicknesses of components in the drawings are arbitrarily illustrated for convenience of explanation, the following embodiments are not limited thereto.

It will be understood that when a layer, region, or component is referred to as being "formed on," another layer, region, or component, it can be directly or indirectly formed on the other layer, region, or component. That is, for example, intervening layers, regions, or components may be present.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

As used herein, the term "and/or" includes any and all combinations of one or more of the associated listed items. Expressions such as "at least one of," when preceding a list of elements, modify the entire list of elements and do not modify the individual elements of the list.

The display apparatus is an apparatus displaying an image, and may be a liquid crystal display (LCD), an electrophoretic display, an organic light-emitting display, an inorganic light-emitting display, a field emission display, a surface-conduction electron-emitter display, a plasma display, or a cathode ray display.

Hereinafter, an organic light-emitting display is described as a display apparatus according to an embodiment, but the display apparatus is not limited thereto, and various types of display apparatuses may be used.

Figure 2:
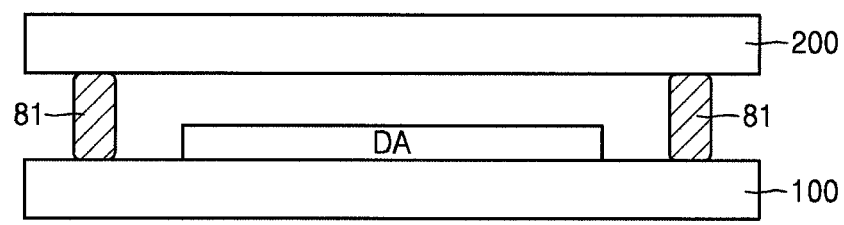
FIG. 2 is a cross-sectional view of a structure where the display apparatus of FIG. 1 is sealed by a sealing substrate.
Figure 3:
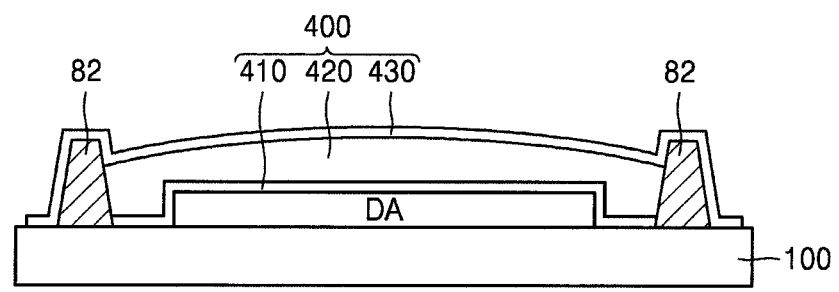
FIG. 3 is a cross-sectional view of a structure where the display apparatus of FIG. 1 is sealed by a thin encapsulation layer.

FIG. 1 is a plan view of a part of a display apparatus, according to an embodiment, FIG. 2 is a cross-sectional view of a structure where the display apparatus of FIG. 1 is sealed by a sealing substrate 200, and FIG. 3 is a cross-sectional view of a structure where the display apparatus of FIG. 1 is sealed by a thin encapsulation layer 400.

Referring to FIG. 1, the display apparatus according to an embodiment includes a substrate 100 including a display area DA where a plurality of pixels P are arranged to display an image, and a non-display area NDA around the display area DA.

The substrate 100 may be formed of glass, a metal, or an organic material including silicon oxide ($SiO_2$) as a main component. According to an embodiment, the substrate 100 may be formed of a flexible material. For example, the substrate 100 may be formed of a flexible plastic material, such as polyimide, but is not limited thereto. As another embodiment, examples of the plastic material include polyethersulphone (PES), polyacrylate (PAR), polyether imide (PEI), polyethylene naphthalate (PEN), polyethylene terephthalate (PET), polyphenylene sulfide (PPS), polyarylate, polyimide, polycarbonate (PC), triacetyl cellulose (TAC), cellulose acetate propionate (CAP), cyclic olefin polymer, and cyclic olefin copolymer.

The plurality of pixels P connected to a gate line GL extending in a first direction and a data line DL extending in a second direction crossing the first direction may be provided in the display area DA to display an image. Each pixel P emits, for example, red, green, blue, or white light, and may include, for example, an organic light-emitting device (OLED). Also, each pixel P may further include devices, such as a thin-film transistor (TFT) and a capacitor, a driving power line, and a common power line.

The pixel P is formed according to an electric combination of the TFT, the TFT connected to the gate line GL, the data line DL, the driving power line, and the common power line, the capacitor, and the OLED, and thus an image may be displayed. The pixel P may have luminance corresponding to a driving current flowing through the OLED, correspondingly to a data signal according to driving power and common power supplied to the pixel P. The display area DA may provide a certain image via light emitted from the plurality of pixels P. In the present specification, the non-display area NDA is an area where the pixel P is not arranged, and thus is an area where an image is not provided.

A terminal unit 20, a driving voltage supply line 30, a common voltage supply line 40, a data distribution circuit unit 50, first and second gate drivers 60 and 70, and a sealing member 80 may be provided in the non-display area NDA.

The terminal unit 20 is provided at an end portion of the substrate 100, and includes a plurality of terminals 21 through 23. The terminal unit 20 is not covered by an insulating layer but is exposed, and may be electrically connected to a controller (not shown), such as a flexible printed circuit board (PCB) or a driving driver integrated chip (IC). The controller changes a plurality of image signals transmitted from an external source to a plurality of image data signals, and transmits the plurality of image data signals to the data distribution circuit unit 50 through the terminal 21. Also, the controller may receive a vertical synchronization signal, a horizontal synchronization signal, and a clock signal to generate a control signal for controlling driving of the first and second gate drivers 60 and 70, and transmit the control signal to each of the first and second gate drivers 60 and 70 through a respective terminal (not shown). The controller transmits a driving voltage and a common voltage respectively to the driving voltage supply line 30 and the common voltage supply line 40 through the terminals 22 and 23.

The driving voltage supply line 30 is provided over the non-display area NDA. For example, the driving voltage supply line 30 may extend in the first direction to correspond to one side of the display area DA over the non-display area NDA. The driving voltage supply line 30 may include a driving connector 31 extending in the second direction crossing the first direction. The driving connector 31 may be connected to the terminal unit 20 to receive a driving voltage from the controller provided in the terminal unit 20. The driving voltage supply line 30 provides the driving voltage to the pixels P.

The common voltage supply line 40 is provided over the non-display area NDA, and provides a common voltage to an opposite electrode 330 provided commonly to the plurality of pixels P. For example, the common voltage supply line 40 may extend along an edge of the substrate 100 except the terminal unit 20 in a loop shape having one open side. The common voltage supply line 40 may include a common connector 41 extending in the second direction. The common connector 41 may be spaced apart in parallel from the driving connector 31.

A partial region of the common voltage supply line 40 may have a stepped shape. The stepped shape may be provided in a region facing the driving voltage supply line 30. In this case, the driving voltage supply line 30 may also have a stepped shape to correspond to a shape of the common voltage supply line 40.

The common voltage supply line 40 may surround parts of the display area DA and the driving voltage supply line 30. In this case, as shown in a region I of FIG. 1, the common voltage supply line 40 may include a bent portion bent to correspond to one corner of the driving voltage supply line 30, and an inner side of the bent portion may have a stepped shape. An end portion of the driving voltage supply line 30 may have a shape corresponding to the stepped shape. Detailed descriptions thereof are provided below.

The data distribution circuit unit 50 may be provided between the display area DA and the driving voltage supply line 30. The data distribution circuit unit 50 may be connected to the terminal unit 20 and distribute a data signal to the plurality of pixels P upon receiving the data signal from the controller (not shown) connected to the terminal unit 20. The data distribution circuit unit 50 may include at least one TFT. By separately including the data distribution circuit unit 50, a size of the controller may be reduced. The controller is mounted on the terminal unit 20 of the non-display area NDA, and thus the reduction of the size of the controller may result in reduction of an area of the non-display area NDA.

The first and second gate drivers 60 and 70 are provided over the non-display area NDA of the substrate 100, and generate and provide a gate signal to each pixel P through the gate line GL. For example, the first gate driver 60 may be provided at the left of the display area DA and the second gate driver 70 may be provided at the right of the display area DA.

The sealing member 80 may surround a circumference of the display area DA. The sealing member 80 may be a member provided to seal the display area DA from outer air.

For example, referring to FIG. 2, the display area DA may be sealed by the sealing substrate 200, and in this case, the display apparatus includes a sealing member 81 bound to the sealing substrate 200, and the sealing substrate 200 faces the substrate 100. The sealing substrate 200 may be formed of any one of various materials, such as a glass material, a plastic material, and a metal material. The sealing member 81 binds the substrate 100 to the sealing substrate 200 to block the display area DA from external moisture and external air. The sealing member 81 may be formed of epoxy, sealant, glass, or frit. The substrate 100 and the sealing substrate 200 may be bonded together by hardening the sealing member 81 by using a heat source, such as resistance heat or a laser beam.

As another example, referring to FIG. 3, the display area DA may be sealed by the thin encapsulation layer 400. The thin encapsulation layer 400 may extend up to the outside of the display area DA while covering the display area DA. The thin encapsulation layer 400 may include a first inorganic encapsulation layer 410, an organic encapsulation layer 420, and a second inorganic encapsulation layer 430.

The first inorganic encapsulation layer 410 covers the opposite electrode 330, and may include ceramic, metal oxide, metal nitride, metal carbide, metal oxynitride, indium oxide ($In_2O_3$), tin oxide ($SnO_2$), indium thin oxide (ITO), silicon oxide, silicon nitride, and/or silicon oxynitride.

The organic encapsulation layer 420 may include at least one material selected from among acryl, methacryl, polyester, polyethylene, polypropylene, PET, PEN, PC, polyimide, PES, polyoxymethylene, polyarylate, and hexamethyldisiloxane.

The second inorganic encapsulation layer 430 covers the organic encapsulation layer 420, and may include ceramic, metal oxide, metal nitride, metal carbide, metal oxynitride, $In_2O_3$, $SnO_2$, ITO, silicon oxide, silicon nitride, and/or silicon oxynitride.

Here, a sealing member 82 may be a dam member for preventing (or reducing instances of) formation of an edge tail of the organic encapsulation layer 420 by preventing (or reducing instances of) an organic material from flowing along an edge of the substrate 100 while the organic encapsulation layer 420 is formed. Accordingly, the organic encapsulation layer 420 may be located at an inner side of the sealing member 82.

As such, when the display apparatus includes the sealing member 80, 81, or 82, the size of the opposite electrode 330 may be set considering the sealing member 80, 81, or 82.

The opposite electrode 330 is commonly provided to the plurality of pixels P, overlaps the display area DA, the driving voltage supply line 30, and the data distribution circuit unit 50, and partially overlaps the common voltage supply line 40. The opposite electrode 330 is electrically insulated from the driving voltage supply line 30 and the data distribution circuit unit 50 by an insulating layer, while directly contacting the common voltage supply line 40 to receive a common voltage supplied from the common voltage supply line 40.

The opposite electrode 330 may be formed by a deposition process using an open mask, and may be spaced apart from the sealing member 80, 81, or 82. Accordingly, damage to the opposite electrode 330 may be reduced during a sealing process. In order to reduce the area of the non-display area NDA, the opposite electrode 330 may not cover all of the common voltage supply line 40, but may cover only a part of the common voltage supply line 40.

A connection conductive layer 340 may be electrically connected to a driving voltage line (not shown) provided in the display area DA, and the driving voltage supply line 30. The connection conductive layer 340 may overlap the data distribution circuit unit 50 and may be electrically insulated by the insulating layer.

Figure 4:
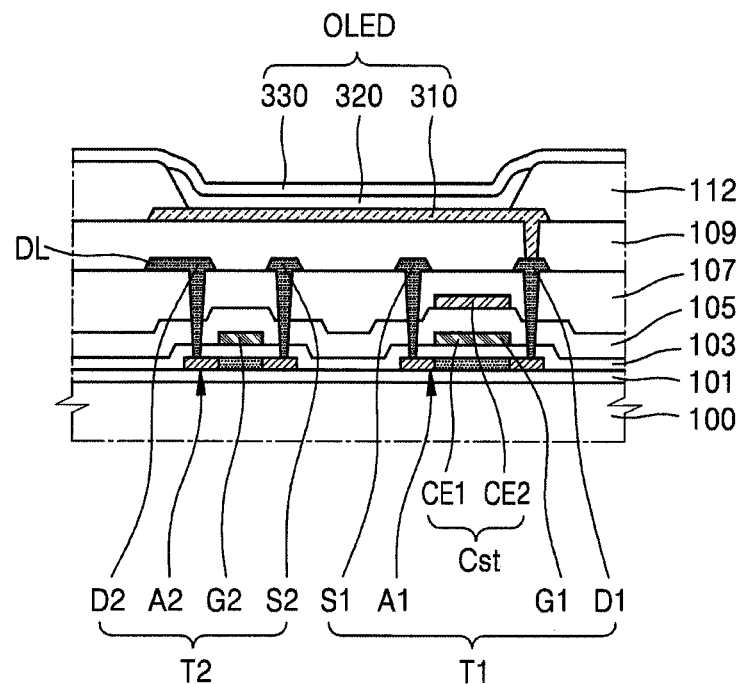
FIG. 4 is a cross-sectional view of a part that may be included in a display area, according to some example embodiments of the present invention.
Figure 5:
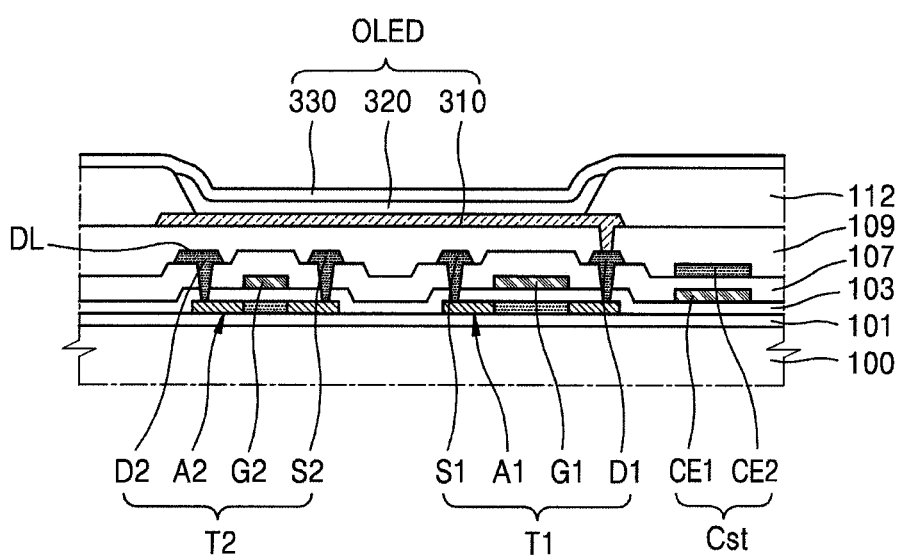
FIG. 5 is a cross-sectional view of a part that may be included in a display area, according to some example embodiments of the present invention.

FIGS. 4 and 5 are cross-sectional views of a part that may be included in the display area DA, according to embodiments.

Referring to FIG. 4, a first TFT T1, a second TFT T2, a storage capacitor Cst, and an organic light-emitting device OLED may be provided in the display area DA. For convenience of description, components are described in a stacked order.

A buffer layer 101 is provided on the substrate 100 to reduce or prevent penetration of impurities, moisture, or external air from the bottom of the substrate 100, and provide a flat surface on the substrate 100. The buffer layer 101 may include an inorganic material, such as oxide or nitride, or may include an organic material or a compound of inorganic and organic materials. The buffer layer 101 may have a single-layer or multilayer structure of an inorganic material and an organic material.

The first TFT T1 includes a semiconductor layer A1, a gate electrode G1, a source electrode S1, and a drain electrode D1, and the second TFT T2 includes a semiconductor layer A2, a gate electrode G2, a source electrode S2, and a drain electrode D2.

The semiconductor layers A1 and A2 may include amorphous silicon or polycrystalline silicon. As another embodiment, the semiconductor layers A1 and A2 may include an oxide of at least one material from among indium (In), gallium (Ga), tin (Sn), zirconium (Zr), vanadium (V), hafnium (Hf), cadmium (Cd), germanium (Ge), chromium (CR contact region), titanium (Ti), and zinc (Zn). The semiconductor layers A1 and A2 may each include a channel region, and source and drain regions where impurities are doped.

The gate electrodes G1 and G2 are provided over the semiconductor layers A1 and A2 with a gate insulating layer 103 inbetween. The gate electrodes G1 and G2 may include molybdenum (Mo), aluminum (Al), copper (Cu), or Ti, and may include a single layer or a multilayer. For example, the gate electrodes G1 and G2 may be a single layer of Mo.

The gate insulating layer 103 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The source electrodes S1 and S2 and the drain electrodes D1 and D2 are provided over an interlayer insulating layer 107. The source electrodes S1 and S2 and the drain electrodes D1 and D2 may include a conductive material including Mo, Al, Cu, or Ti, and may have a single layer or multiplayer including the conductive material. For example, the source electrodes S1 and S2 and the drain electrodes D1 and D2 may have a multilayer structure of Ti/Al/Ti.

The interlayer insulating layer 107 may include $SiO_x$, $SiN_x$, SiON, $Al_2O_3$, $TiO_2$, $Ta_2O_5$, $HfO_2$, or $ZnO_2$.

A first electrode CE1 of the storage capacitor Cst may overlap the first TFT T1. For example, the gate electrode G1 of the first TFT T1 may also function as the first electrode CE1 of the storage capacitor Cst.

A second electrode CE2 of the storage capacitor Cst overlaps the first electrode CE1, with a dielectric layer 105 inbetween. The second electrode CE2 may include a conductive material including Mo, Al, Cu, or Ti, and may include a multilayer or single layer including the conductive material. For example, the second electrode CE2 may be a single layer of Mo or a multilayer of Mo/Al/Mo.

The dielectric layer 105 may include an inorganic material including oxide or nitride. For example, the dielectric layer 105 may include $SiO_2$, $SiN_x$, SiON, $Al_2O_3$, $TiO_2$, $Ta_2O_5$, $HfO_2$, or $ZnO_2$.

A planarization layer 109 is provided on the source electrodes S1 and S2, and the drain electrodes D1 and D2, and the organic light-emitting device OLED may be located over the planarization layer 109. The planarization layer 109 may include a single layer or multilayer of a film formed of an organic material. Examples of the organic material include general-purpose polymer, such as polymethyl methacrylate (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. Also, the planarization layer 109 may have a complex stacked structure of an inorganic insulating film and an organic insulating film.

The organic light-emitting device OLED includes a pixel electrode 310, an emission layer 320, and the opposite electrode 330.

The pixel electrode 310 may be a reflective electrode. For example, the pixel electrode 310 may include a reflective film formed of Ag, Mg, Al, Pt, Pd, Au, Ni, Nd, Ir, Cr, or a compound thereof, and a transparent or semi-transparent electrode layer formed on the reflective film. The transparent or semi-transparent electrode layer may include at least one material selected from among ITO, indium zinc oxide (IZO), ZnO, $In_2O_3$, indium gallium oxide (IGO), and aluminum zinc oxide (AZO).

A pixel-defining layer 112 formed of an insulating material is provided on the pixel electrode 310. The pixel-defining layer 112 may be formed by a spin coating method or the like by using at least one organic insulating material selected from among polyimide, polyamide, acryl resin, benzocyclobutene, and phenol resin. The pixel-defining layer 112 exposes the pixel electrode 310, and the emission layer 320 is provided on the exposed region of the pixel electrode 310.

The emission layer 320 may include an organic material including fluorescent or phosphorous material emitting red, green, blue, or white light. The emission layer 320 may include a low-molecular weight organic material or a polymer organic material, and functional layers, such as a hole transport layer (HTL), a hole injection layer (HIL), an electron transport layer (ETL), and an electron injection layer (EIL) may be selectively further provided below and over the emission layer 320.

The opposite electrode 330 may be a translucent electrode. For example, the opposite electrode 330 may be a transparent or semi-transparent electrode, and may be formed of a thin metal film having a low work function and including Li, Ca, LiF/Ca, LiF/Al, Al, Ag, Mg, or a compound thereof. Also, a transparent conductive oxide (TCO) film formed of ITO, IZO, ZnO, or $In_2O_3$ may be further provided on the thin metal film.

Referring to FIG. 5, the storage capacitor Cst may be provided not to overlap the first TFT T1. Only descriptions of components different than those described with reference to FIG. 4 will be given.

The first electrode CE1 of the storage capacitor Cst may be formed of the same material and on the same layer as the gate electrodes G1 and G2, the second electrode CE2 may be formed of the same material and on the same layer as the drain electrodes D1 and D2, and the interlayer insulating layer 107 may also function as a dielectric material.

In FIGS. 4 and 5, the first and second TFTs T1 and T2 are a top gate type in which the gate electrodes G1 and G2 of the first and second TFTs T1 and T2 are provided respectively on the semiconductor layers A1 and A2, with the gate insulating layer 103 inbetween, but an embodiment is not limited thereto. According to another embodiment, the first and second TFTs T1 and T2 may be a bottom gate type.

In FIGS. 4 and 5, the first TFT T1 and the pixel electrode 310 are connected to each other through a via hole of the planarization layer 109, but an embodiment is not limited thereto.

In FIGS. 4 and 5, only two TFTs and one storage capacitor are illustrated, but an embodiment is not limited thereto. For example, one pixel P may include seven TFTs and one storage capacitor.

Figure 6:
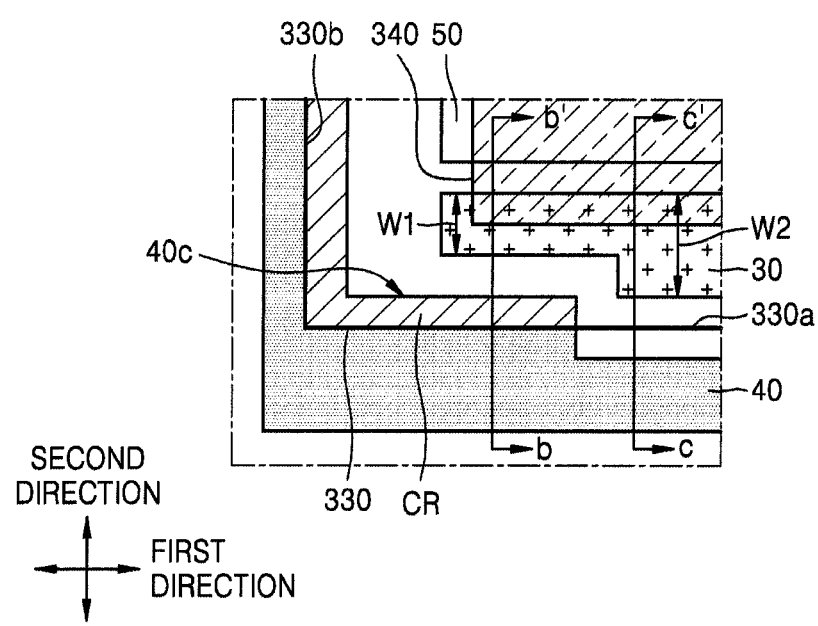
FIG. 6 is an enlarged plan view of a region I of FIG. 1.

FIG. 6 is an enlarged plan view of a region I of FIG. 1. Hereinafter, the stepped shape formed at a part of the common voltage supply line 40, and an arrangement relationship between the common voltage supply line 40 and the opposite electrode 330 will be described.

Referring to FIG. 6, the part of the common voltage supply line 40 has the stepped shape. The stepped shape is a shape in which a width of the common voltage supply line 40 is increased or decreased stepwise in one direction on a plane. In FIG. 6, the width of the common voltage supply line 40 is decreased stepwise towards the center of the display area DA in the first direction.

Additionally, the common voltage supply line 40 may have a bent portion 40C bent to correspond to a corner of the driving voltage supply line 30, and an inner side of the bent portion 40C may have a stepped shape. The inner side of the bent portion 40C may be a region of the common voltage supply line 40 adjacent to the driving voltage supply line 30.

The opposite electrode 330 overlaps a part of the common voltage supply line 40 and contacts the common voltage supply line 40 in a contact region CR to be electrically connected thereto. The opposite electrode 330 may be approximately rectangular, and may include a first side 330a extending in the first direction and a second side 330b extending in the second direction.

According to the current embodiment, the first side 330a of the opposite electrode 330 may extend in the first direction through the stepped shape of the common voltage supply line 40. Also, at least a part of the first side 330a may be spaced apart in parallel from the common voltage supply line 40 to extend in the first direction. According to some embodiments, at least a part of the first side 330a may extend in the first direction between the common voltage supply line 40 and the driving voltage supply line 30.

In the current embodiment, the second side 330b of the opposite electrode 330 continuously contacts the common voltage supply line 40, and only the first side 330a of the opposite electrode 330 contacts the stepped shape of the common voltage supply line 40.

Additionally, the driving voltage supply line 30 is spaced apart from the common voltage supply line 40, and an end portion of the driving voltage supply line 30 may have a stepped shape as the shape of the common voltage supply line 40. Accordingly, the driving voltage supply line 30 has a width W1 in the second direction near a line b-b', and has a width W2 in the second direction near a line c-c', wherein W2>W1.

If the first side 330a of the opposite electrode 330 does not contact the common voltage supply line 40, a voltage drop phenomenon may be generated with respect to the common voltage. However, for the first side 330a of the opposite electrode 330 to contact all regions of the common voltage supply line 40 extending in the first direction, a contact region in the second direction needs to be secured, thereby increasing the area of the non-display area NDA.

In this regard, in the current embodiment, the part of the common voltage supply line 40 has the stepped shape so as to reduce the area of the non-display area NDA, and at least a part of the first side 330a of the opposite electrode 330 contacts the common voltage supply line 40 such that generation of a voltage drop of the common voltage is reduced. Also, the width of the driving voltage supply line 30 is secured to reduce generation of a voltage drop of the driving voltage.

Figure 7:
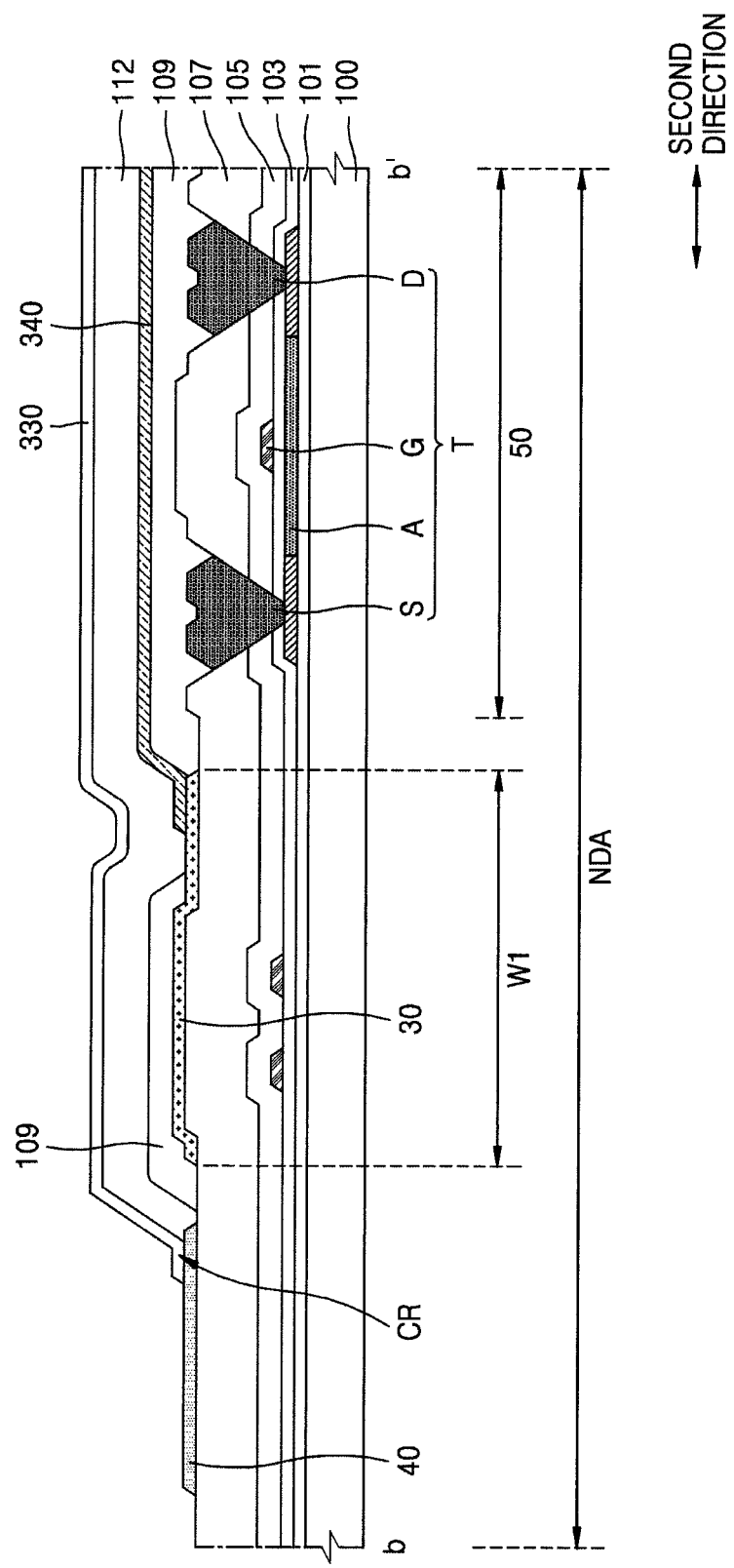
FIG. 7 is a cross-sectional view taken along a line b-b' of FIG. 6.
Figure 8:
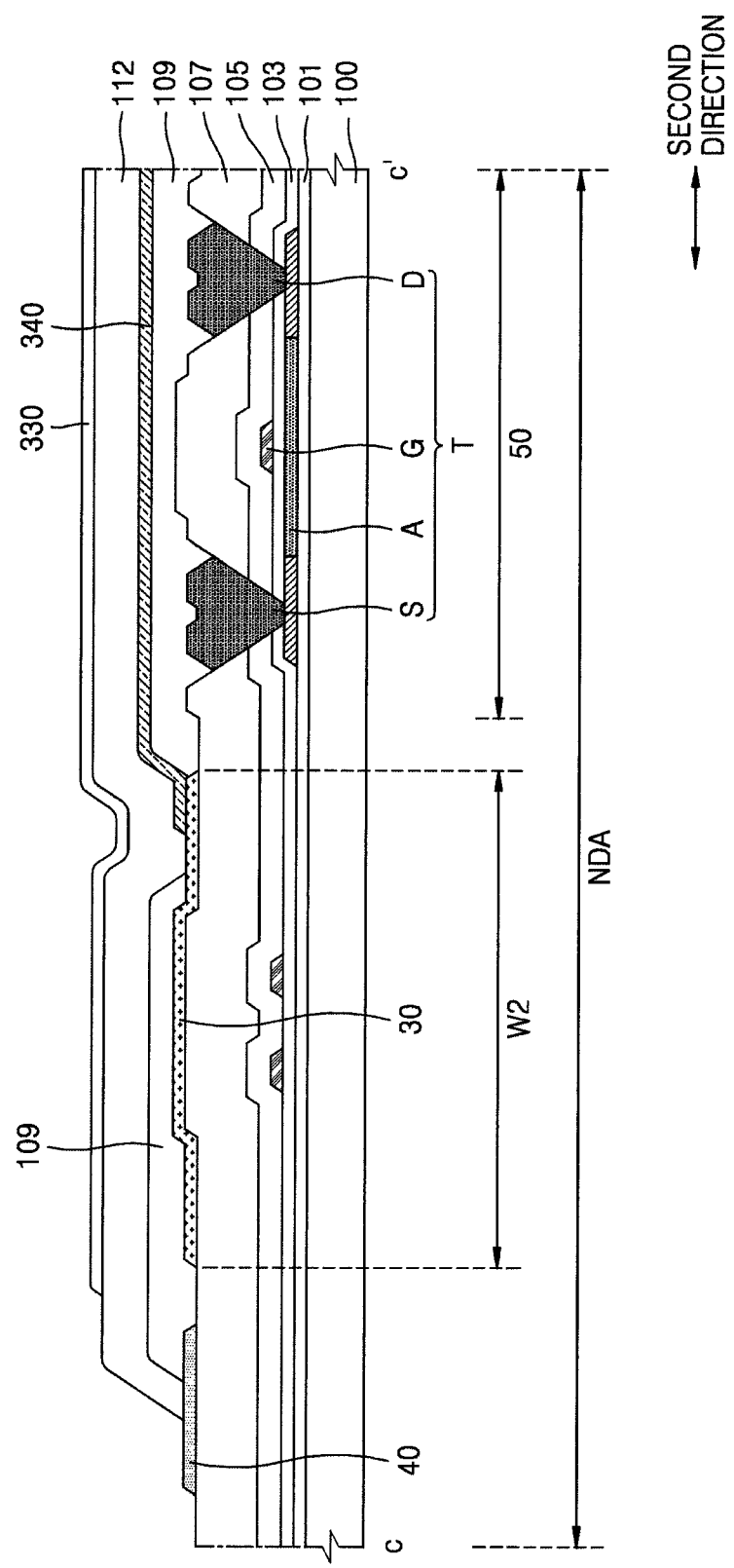
FIG. 8 is a cross-sectional view taken along a line c-c' of FIG. 6.

FIG. 7 is a cross-sectional view taken along the line b-b' of FIG. 6, and FIG. 8 is a cross-sectional view taken along the line c-c' of FIG. 6. In FIGS. 4, 7, and 8, like reference numerals denote like elements, and descriptions thereof are not provided again.

The data distribution circuit unit 50 is provided in the non-display area NDA, and includes at least one TFT T. The TFT T includes a semiconductor layer A, a gate electrode G, a source electrode S, and a drain electrode D.

The semiconductor layer A may include amorphous silicon or polycrystalline silicon. According to another embodiment, the semiconductor layer A may include oxide of at least one material selected from In, Ga, Sn, Zr, V, Hf, Cd, Ge, Cr, Ti, and Zn. The semiconductor layer A may include a channel region, and source and drain regions doped with impurities.

The gate electrode G is provided over the semiconductor layer A with the gate insulating layer 103 inbetween. The gate electrode G may include Mo, Al, Cu, or Ti, and may have a single layer or a multilayer. For example, the gate electrode G may be a single layer of Mo.

The source electrode S and the drain electrode D are provided on the interlayer insulating layer 107. The source electrode S and the drain electrode D may include a conductive material including Mo, Al, Cu, or Ti, and may include a multilayer or single layer including the conductive material. For example, the source electrode S and the drain electrode D may have a multilayer structure of Ti/Al/Ti.

The driving voltage supply line 30 and the common voltage supply line 40 may be formed of the same material. The driving voltage supply line 30 and the common voltage supply line 40 may include the same material as the source electrode S and the drain electrode D. In other words, the driving voltage supply line 30 and the common voltage supply line 40 may include a conductive material including Mo, Al, Cu, or Ti, and may include a multilayer or a single layer including the conductive material. For example, the driving voltage supply line 30 and the common voltage supply line 40 may have a multilayer structure of Ti/Al/Ti.

The connection conductive layer 340 is provided over the TFT T of the data distribution circuit unit 50, and the TFT T and the connection conductive layer 340 may be insulated by the planarization layer 109.

An end portion of the connection conductive layer 340 may be directly connected to the driving voltage supply line 30 to transmit a driving voltage of the driving voltage supply line 30 to the display are DA.

The connection conductive layer 340 may be formed of the same material as the pixel electrode 310. For example, the connection conductive layer 340 may include a reflective film formed of Ag, Mg, Al, Pt, Pd, Au, Ni, Nd, Ir, Cr, or a compound thereof, and a transparent or semi-transparent conductive layer formed on the reflective film. The transparent or semi-transparent conductive layer may include at least one material selected from among ITO, IZO, ZnO, $In_2O_3$, IGO, and AZO.

The pixel-defining layer 112 and the opposite electrode 330 are stacked over the connection conductive layer 340. In FIG. 7, an end portion of the opposite electrode 330 is directly connected to the common voltage supply line 40 in the contact region CR. In FIG. 8, an end portion of the opposite electrode 330 does not contact the common voltage supply line 40, though the opposite electrode 330 is provided over the common voltage supply line 40 and the driving voltage supply line 30 (확인바람), wherein a width W2 of the driving voltage supply line 30 of FIG. 8 is greater than a width W1 of the driving voltage supply line of FIG. 7, and thus a voltage drop of a driving voltage may be prevented (or reduced).

Figure 9:
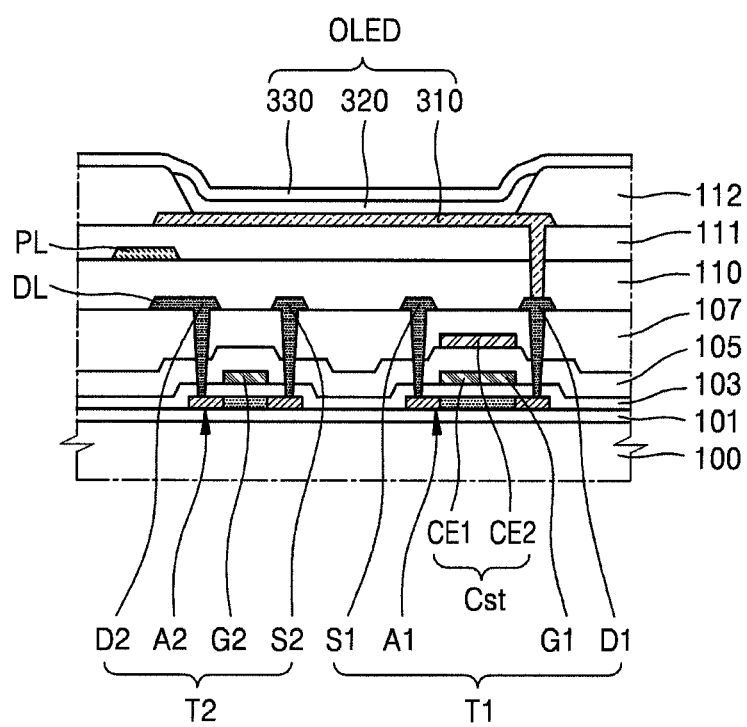
FIG. 9 is a cross-sectional view of a part that may be included in a display area, according to some example embodiments of the present invention.

FIG. 9 is a cross-sectional view of a part that may be included in the display area DA, according to another embodiment.

Referring to FIG. 9, a first planarization layer 110 and a second planarization layer 111 may be provided over the data line DL, and a conductive layer PL may be further provided on the first planarization layer 110. Like reference numerals denote like elements in FIGS. 4 and 9, and thus, descriptions thereof are the same as those given with reference to FIG. 4, and only differences thereof will now be described.

The first and second planarization layers 110 and 111 are each an insulating layer, and may include an organic material. Examples of the organic material include an imide-based polymer, general-purpose polymer, such as PMMA or PS, a polymer derivative having a phenol-based group, an acryl-based polymer, an aryl ether-based polymer, an amide-based polymer, a fluorine-based polymer, a p-xylene-based polymer, a vinyl alcohol-based polymer, and a blend thereof.

Also, the first and second planarization layers 110 and 111 may each include an inorganic material, such as SiO, SiN, and/or SiON. Also, the first planarization layer 110 may be formed of an inorganic material and the second planarization layer 111 may be formed of an organic material. The first and second planarization layers 110 and 111 may each have a single layer or multilayer structure.

The conductive layer PL provided on the first planarization layer 110 may operate as a driving voltage line transmitting a driving voltage or a data line transmitting a data signal. The conductive layer PL may be connected to the data line DL provided on the first planarization layer 110 through a contact hole defined by the first planarization layer 110. The conductive layer PL may include Mo, Al, Cu, or Ti, and may include a multilayer or a single layer.

As such, when the first planarization layer 110, the conductive layer PL, and the second planarization layer 111 are provided in the display area DA, the connection conductive layer 340 of FIG. 7 may be formed of the same material as the conductive layer PL. In other words, the connection conductive layer 340 of FIG. 7 may include Mo, Al, Cu, or Ti, and may include a multilayer or a single layer.

Figure 10:
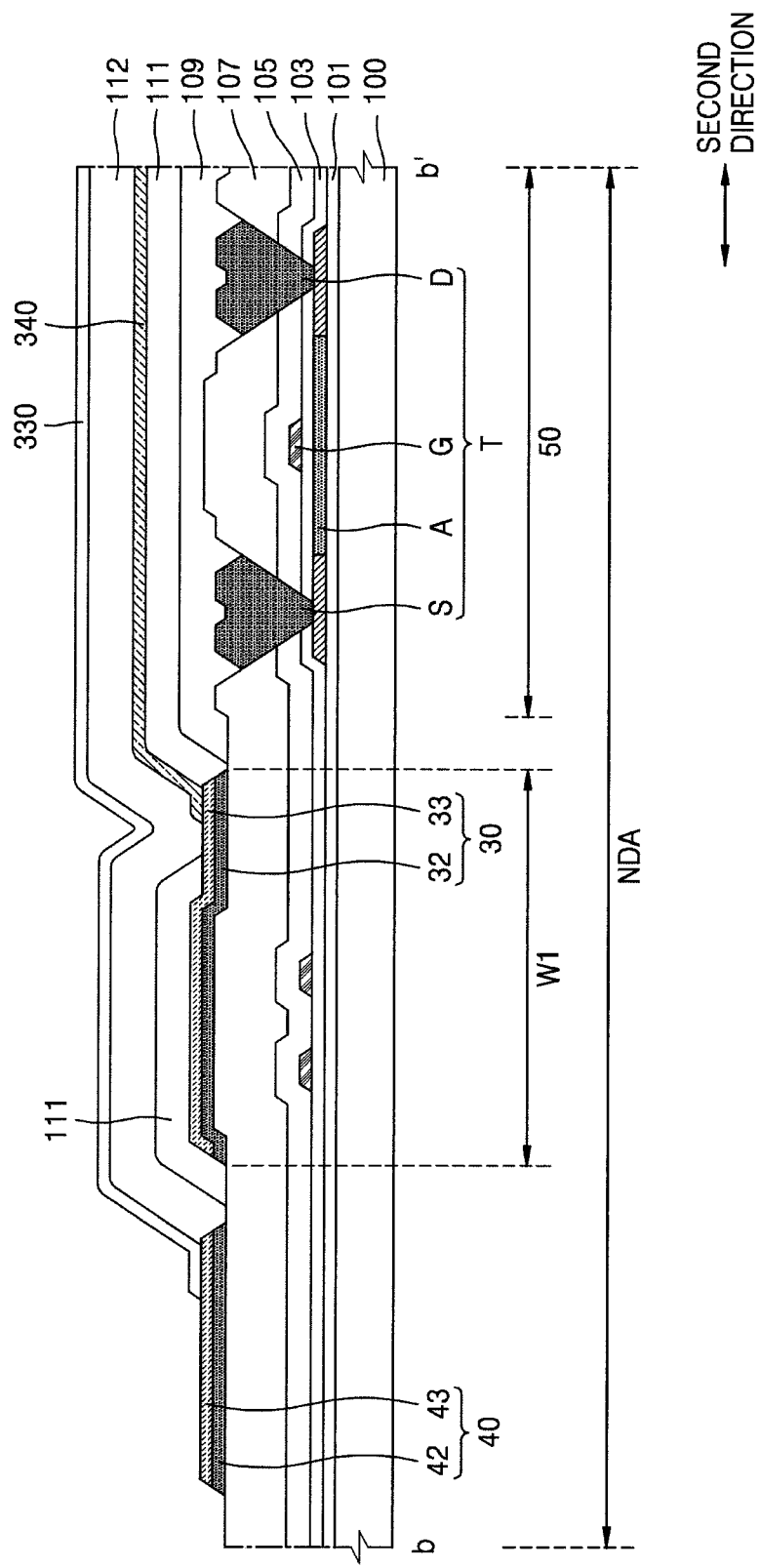
FIG. 10 is a cross-sectional view of a part of a non-display area, according to some example embodiments of the present invention.

FIG. 10 is a cross-sectional view of the non-display area NDA taken along the line b-b', according to an embodiment. Like reference numerals denote like elements in FIGS. 7, 8, and 10, and thus, descriptions thereof are the same as those given with reference to FIGS. 7 and 8.

Referring to FIG. 10, the driving voltage supply line 30 and the common voltage supply line 40 may each include a plurality of layers. The driving voltage supply line 30 may include a first layer 32 and a second layer 33, which are stacked on each other, wherein the first layer 32 is formed of the same material as the source electrode S and the second layer 33 is formed of the same material as the conductive layer PL of FIG. 9. The common voltage supply line 40 may include a first layer 42 and a second layer 43, which are stacked on each other, wherein the first layer 42 is formed of the same material as the source electrode S and the second layer 43 is formed of the same material as the conductive layer PL of FIG. 9.

In this case, the first and second planarization layers 110 and 111 may be stacked between the TFT T and the connection conductive layer 340.

As such, when the driving voltage supply line 30 and the common voltage supply line 40 each include a plurality of layers, the driving voltage supply line 30 and the common voltage supply line 40 may be thick, and thus generation of a voltage drop phenomenon may be prevented (or reduced).

Figure 11:
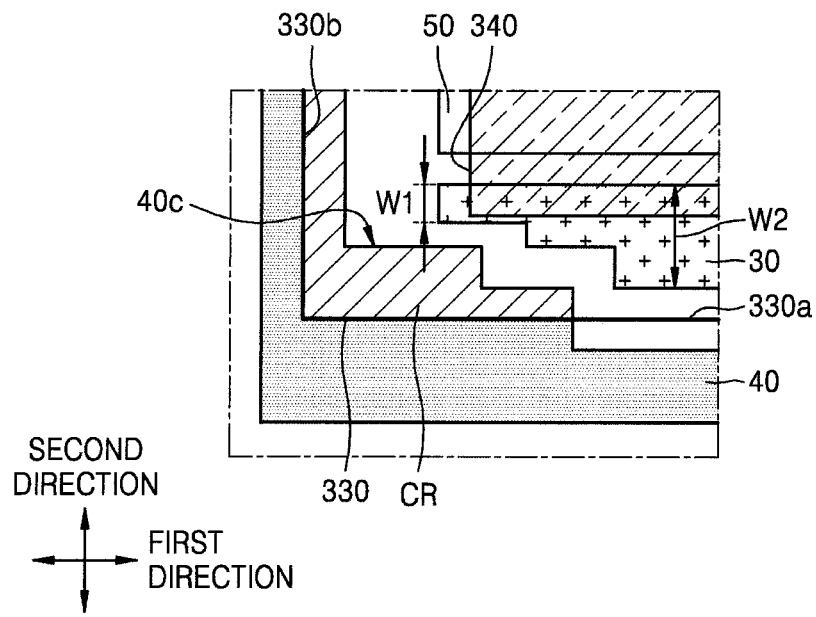
FIG. 11 is a plan view of a part of a display apparatus, according to some example embodiments of the present invention.
Figure 12:
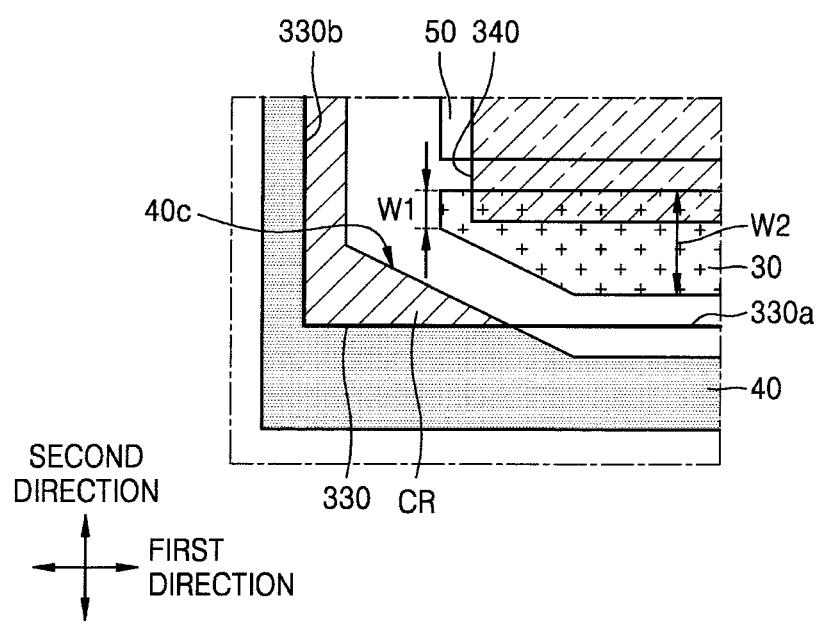
FIG. 12 is a plan view of a part of a display apparatus, according to some example embodiments of the present invention.

FIGS. 11 and 12 are plan views of a part of a display apparatus, according to other embodiments.

Referring to FIG. 11, a part of the common voltage supply line 40 has a stepped shape. In the present specification, the stepped shape is a shape in which the width of the common voltage supply line 40 increases or decreases stepwise towards one direction on a plane. In FIG. 11, the width of the common voltage supply line 40 decreases stepwise towards the center of the display area DA in the first direction.

Additionally, the common voltage supply line 40 has the bent portion 40C bent to correspond to one corner of the driving voltage supply line 30, and the inner side of the bent portion 40C has a stepped shape.

The opposite electrode 330 overlaps a part of the common voltage supply line 40, and contacts the common voltage supply line 40 in the contact region CR to be electrically connected thereto. The opposite electrode 330 may be approximately rectangular, and may include the first side 330a extending in the first direction and the second side 330b extending in the second direction.

According to the current embodiment, the first side 330a of the opposite electrode 330 may extend in the first direction through the stepped shape of the common voltage supply line 40. Also, at least a part of the first side 330a may be spaced apart in parallel from the common voltage supply line 40 to extend in the first direction. According to some embodiments, at least a part of the first side 330a may extend in the first direction between the common voltage supply line 40 and the driving voltage supply line 30.

In FIG. 6, the stepped shape of the inner side of the bent portion 40C has one step, but in FIG. 11, the stepped shape of the inner side of the bent portion 40C has two steps. According to an embodiment, the number of steps is not limited. Accordingly, the area of the contact region CR between the opposite electrode 330 and the common voltage supply line 40 may be increased.

Additionally, the driving voltage supply line 30 may be spaced apart from the common voltage supply line 40, and an end portion of the driving voltage supply line 30 may have a stepped shape like the shape of the common voltage supply line 40. Accordingly, the end portion of the driving voltage supply line 30 has a width W1 in the second direction, and has a width W2 at the center thereof, wherein W2>W1.

Here, a width of the driving voltage supply line 30 in the second direction may be determined considering a voltage drop (IR-DROP), and a voltage drop phenomenon is not generated when the width of the driving voltage supply line 30 is large.

In the current embodiment, the bent portion 40C of the common voltage supply line 40 has a stepped shape so as to reduce the area of the non-display area NDA, and at least a part of the first side 330a of the opposite electrode 330 contacts the common voltage supply line 40 such that generation of a voltage drop of the common voltage is reduced. Also, the width of the driving voltage supply line 30 may be secured so as to reduce generation of a voltage drop of the driving voltage.

Referring to FIG. 12, the common voltage supply line 40 has an inclined side at a part of the common voltage supply line 40 with respect to the first direction, and the first side 330a of the opposite electrode 330 extends in the first direction through the inclined side.

Additionally, the common voltage supply line 40 may have the bent portion 40C bent to correspond to one corner of the driving voltage supply line 30, and the inner side of the bent portion 40C may include an inclined side with respect to the first direction. In the present specification, the inclined side in the first direction denotes a side having a height gradually increasing or decreasing in the first direction on a plane. The common voltage supply line 40 has the inclined side with respect to the first direction, and thus the width of the common voltage supply line 40 in the second direction has a gradually increasing or decreasing area. In FIG. 11, the width of the common voltage supply line 40 in the second direction has an area gradually decreasing towards the center of the display area DA.

The opposite electrode 330 overlaps a part of the common voltage supply line 40, and is electrically connected to the common voltage supply line 40 by contacting the common voltage supply line 40 at the contact region CR.

In the present embodiment, the first side 330a of the opposite electrode 330 may extend in the first direction through the inclined side of the common voltage supply line 40. At least a part of the first side 330a may be spaced apart in parallel from the common voltage supply line 40 and extend in the first direction. According to some embodiments, at least a part of the first side 330a may extend in the first direction between the common voltage supply line 40 and the driving voltage supply line 30.

In the present embodiment, the second side 330b of the opposite electrode 330 continuously contacts the common voltage supply line 40, but the first side 330a of the opposite electrode 330 contacts the common voltage supply line 40 only near the inclined side.

Additionally, the driving voltage supply line 30 is spaced apart from the common voltage supply line 40, and an end portion of the driving voltage supply line 30 may have an inclined side according to the shape of the common voltage supply line 40. Accordingly, the end portion of the driving voltage supply line 30 has a width W1 in the second direction, and has a width W2 in the second direction near the center thereof, wherein W2>W1.

If the first side 330a of the opposite electrode 330 does not contact the common voltage supply line 40, a voltage drop phenomenon may be generated with respect to the common voltage. However, for the first side 330a of the opposite electrode 330 to contact all regions of the common voltage supply line 40 extending in the first direction, a contact region in the second direction needs to be secured, thereby increasing the area of the non-display area NDA.

In the current embodiment, the part of the common voltage supply line 40 has the inclined side so as to reduce the area of the non-display area NDA, and at least a part of the first side 330a of the opposite electrode 330 contacts the common voltage supply line 40 such that generation of a voltage drop of the common voltage is reduced. Also, the width of the driving voltage supply line 30 is secured to reduce generation of a voltage drop of the driving voltage.

As described above, according to an embodiment, a display apparatus having a small non-display area may be realized while reducing generation of a voltage drop phenomenon.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
   a substrate comprising a display area where a plurality of pixels are arranged to display an image, and a non-display area around the display area;
   an opposite electrode commonly provided to the plurality of pixels;
   a driving voltage supply line extending in a first direction to correspond to one of sides of the display area in the non-display area, and configured to supply a driving voltage to the plurality of pixels; and
   a common voltage supply line comprising a bent portion that is bent to correspond to one corner of the driving voltage supply line in the non-display area, and configured to supply a common voltage by being connected to the opposite electrode,
   wherein an inner side of the bent portion has a stepped shape or has an inclined side with respect to the first direction, and the driving voltage supply line has a stepped shape or an inclined side corresponding to the stepped shape or inclined side of the common voltage supply line,
   the opposite electrode overlaps at least parts of the display area, the driving voltage supply line, and the common voltage supply line, and has a first side extending in the first direction through the stepped shape or the inclined side and a second side extending in a second direction crossing the first direction, and
   the first side of the opposite electrode comprises a first portion overlapped with the common voltage supply line and a second portion disposed between the driving voltage supply line and the common voltage supply line extending in the first direction in a plan view,
   wherein at least a portion of the driving voltage supply line and the common voltage supply line extend in parallel in the first direction with the second portion therebetween, and
   wherein the second side of the opposite electrode continuously contacts the common voltage supply line and only the first side, from among the first and second sides, of the opposite electrode contacts the stepped or inclined shape of the common voltage supply line.

2. The display apparatus of claim 1, wherein an end portion of the driving voltage supply line has the stepped shape or the inclined side to correspond to a shape of the bent portion.

3. The display apparatus of claim 1, wherein the common voltage supply line surrounds at least a portion of the display area, and the opposite electrode overlaps at least a part of the common voltage supply line at the portion of the display area.

4. The display apparatus of claim 1, further comprising:
   a data distribution circuit unit between the display area and the driving voltage supply line, and comprising at least one thin-film transistor (TFT) to distribute a data signal supplied to the plurality of pixels; and
   a connection conductive layer overlapping the data distribution circuit unit with an insulating layer in between, and electrically connecting the driving voltage supply line and the display area.

5. The display apparatus of claim 4, wherein the display area comprises a thin film transistor (TFT) comprising a semiconductor layer, a gate electrode, a source electrode, and a drain electrode, and a pixel electrode connected to the TFT, and
   the connection conductive layer is formed of a same material as the pixel electrode.

6. The display apparatus of claim 1, further comprising a terminal unit configured to apply an electric signal to the display area in the non-display area,
   wherein the driving voltage supply line further comprises a driving connector extending in the second direction crossing the first direction,
   wherein the driving connector is connected to the terminal unit.

7. The display apparatus of claim 1, further comprising a sealing member surrounding the display area,
   wherein the sealing member is spaced apart from the opposite electrode.

8. The display apparatus of claim 1, wherein the display area comprises a thin film transistor (TFT) comprising a semiconductor layer, a gate electrode, a source electrode, and a drain electrode, and the driving voltage supply line and the common voltage supply line comprise a same material as the source electrode.

9. The display apparatus of claim 8, wherein the display area further comprises:
   a first planarization layer covering the TFT;
   a conductive layer over the first planarization layer; and
   a second planarization layer covering the conductive layer,
   wherein each of the driving voltage supply line and the common voltage supply line comprises a first layer and a second layer that are stacked on each other, wherein the first layer is formed of a same material as the source electrode and the second layer is formed of a same material as the conductive layer.

10. A display apparatus comprising:
    a substrate comprising a display area where a plurality of pixels are arranged to display an image, and a non-display area around the display area;
    an opposite electrode commonly provided to the plurality of pixels;
    a driving voltage supply line extending in a first direction to correspond to any one side of the display area in the non-display area, and configured to supply a driving voltage to the plurality of pixels; and
    a common voltage supply line connected to the opposite electrode to supply a common voltage,
    wherein a partial region of the common voltage supply line has a stepped shape or an inclined side with respect to a first direction, and a first side of the opposite electrode extends in the first direction through the stepped shape or the inclined side and a second side of the opposite electrode extends in a second direction crossing the first direction, and the driving voltage supply line has a stepped shape or an inclined side corresponding to the stepped shape or inclined side of the common voltage supply line, and
    the first side of the opposite electrode comprises a first portion overlapped the common voltage supply line and a second portion disposed between the driving voltage supply line and the common voltage supply line extending in the first direction in a plan view,
    wherein at least a portion of the driving voltage supply line and the common voltage supply line extend in parallel in the first direction with the second portion therebetween, and
    wherein the second side of the opposite electrode continuously contacts the common voltage supply line and only the first side, from among the first and second sides, of the opposite electrode contacts the stepped or inclined shape of the common voltage supply line.

11. The display apparatus of claim 10, wherein the partial region of the common voltage supply line having the shaped shape or the inclined side faces the driving voltage supply line, and the driving voltage supply line has a stepped shape or an inclined side correspondingly to a shape of the common voltage supply line.

12. The display apparatus of claim 10, further comprising:
    a data distribution circuit unit between the display area and the driving voltage supply line, and comprising at least one thin-film transistor (TFT) configured to distribute a data signal supplied to the plurality of pixels; and
    a connection conductive layer overlapping the data distribution circuit unit with an insulating layer in between, and electrically connecting the driving voltage supply line and the display area.

13. The display apparatus of claim 12, wherein the display area comprises a TFT comprising a semiconductor layer, a gate electrode, a source electrode, and a drain electrode, and a pixel electrode connected to the TFT, and
    the connection conductive layer is formed of a same material as the pixel electrode.

14. The display apparatus of claim 12, wherein the display area further comprises a TFT, a first planarization layer covering the TFT, a conductive layer provided over the first planarization layer, and a second planarization layer covering the conductive layer, and
    the connection conductive layer is formed of a same material as the conductive layer.

15. The display apparatus of claim 12, further comprising a terminal unit configured to apply an electric signal to the display area in the non-display area,
    wherein the data distribution circuit unit is connected to the terminal unit.

16. The display apparatus of claim 10, wherein the common voltage supply line surrounds at least a portion of the display area,
    the opposite electrode has a rectangular shape.

17. The display apparatus of claim 10, wherein the display area comprises a TFT comprising a semiconductor layer, a gate electrode, a source electrode, and a drain electrode, and
    the driving voltage supply line and a common voltage supply line are formed of a same material as the source electrode.

18. The display apparatus of claim 17, wherein the display area further comprises:
    a first planarization layer covering the TFT;
    a conductive layer over the first planarization layer; and
    a second planarization layer covering the conductive layer,
    wherein each of the driving voltage supply line and the common voltage supply line comprises a first layer and a second layer that are stacked on each other, wherein the first layer is formed of a same material as the source electrode and the second layer is formed of a same material as the conductive layer.

* * * * *